US011434174B2

(12) United States Patent
Ikeda et al.

(10) Patent No.: US 11,434,174 B2
(45) Date of Patent: Sep. 6, 2022

(54) MEMBER FOR PLASMA PROCESSING APPARATUS, PLASMA PROCESSING APPARATUS WITH THE SAME AND METHOD FOR USING SINTERED BODY

(71) Applicants: NIPPON TUNGSTEN CO., LTD., Fukuoka (JP); TOKYO ELECTRON LIMITED, Tokyo (JP)

(72) Inventors: Takashi Ikeda, Fukuoka (JP); Hajime Ishii, Fukuoka (JP); Kenji Fujimoto, Fukuoka (JP); Naoyuki Satoh, Miyagi (JP); Nobuyuki Nagayama, Miyagi (JP); Koichi Murakami, Miyagi (JP); Takahiro Murakami, Miyagi (JP)

(73) Assignees: NIPPON TUNGSTEN CO., LTD., Fukuoka (JP); TOKYO ELECTRON LIMITED, Tokyo (JP)

(*) Notice: Subject to any disclaimer, the term of this patent is extended or adjusted under 35 U.S.C. 154(b) by 146 days.

(21) Appl. No.: 16/830,025

(22) Filed: Mar. 25, 2020

(65) Prior Publication Data

US 2020/0317582 A1 Oct. 8, 2020

(30) Foreign Application Priority Data

Apr. 4, 2019 (JP) .............................. JP2019-072008

(51) Int. Cl.
*C04B 35/56* (2006.01)
*C23F 4/00* (2006.01)
(Continued)

(52) U.S. Cl.
CPC ............ *C04B 35/5626* (2013.01); *C23F 4/00* (2013.01); *H01L 21/67069* (2013.01);
(Continued)

(58) Field of Classification Search
CPC ........ C04B 35/5626; C04B 2235/3839; C04B 2235/3843; C04B 2235/3847;
(Continued)

(56) References Cited

U.S. PATENT DOCUMENTS 4,828,584 A * 5/1989 Cutler ................. C04B 35/5626
501/87
5,681,783 A * 10/1997 Nilsson ............... C04B 35/6455
501/87
(Continued)

FOREIGN PATENT DOCUMENTS

CN 109314033 A 2/2019
JP S62-047130 A 2/1987
(Continued)

OTHER PUBLICATIONS

KR101849038 machine translation (Year: 2018).*

*Primary Examiner* — Karl E Group
*Assistant Examiner* — Cameron K Miller
(74) *Attorney, Agent, or Firm* — Squire Patton Boggs (US) LLP (57) ABSTRACT

A member for a plasma processing apparatus has a tungsten carbide phase, and a sub-phase including at least one selected from the group consisting of phase I to IV, and phase V, in which the phase I is a carbide phase containing, as a constituent element, at least one of the elements of Group IV, V, and VI of the periodic table excluding W, the phase II is a nitride phase containing, as a constituent element, at least one of the elements of Group IV, V, and VI of the periodic table excluding W, the phase III is a carbonitride phase containing, as a constituent element, at least one of the elements of Group IV, Group V, and Group VI of the periodic table excluding W, the phase IV is a carbon
(Continued)

phase, the phase V is a composite carbide phase which is represented by a formula $W_xM_yC_z$.

14 Claims, 2 Drawing Sheets

(51) Int. Cl.
*H01L 21/67* (2006.01)
*H01J 37/32* (2006.01)

(52) U.S. Cl.
CPC ............ *C04B 2235/3839* (2013.01); *C04B 2235/3843* (2013.01); *C04B 2235/3847* (2013.01); *C04B 2235/3856* (2013.01); *C04B 2235/3886* (2013.01); *C04B 2235/422* (2013.01); *C04B 2235/425* (2013.01); *C04B 2235/963* (2013.01); *C04B 2235/9669* (2013.01); *H01J 37/3244* (2013.01); *H01J 37/32477* (2013.01); *H01J 37/32642* (2013.01); *H01J 37/32715* (2013.01); *H01J 2237/2007* (2013.01); *H01J 2237/334* (2013.01)

(58) Field of Classification Search
CPC .... C04B 2235/3856; C04B 2235/3886; C04B 2235/422; C04B 2235/425; C04B 2235/963; C04B 2235/9669; C23F 4/00; H01L 21/67069
See application file for complete search history.

(56) References Cited

U.S. PATENT DOCUMENTS

| | | | |
|---|---|---|---|
| 2011/0111945 | A1* | 5/2011 | Peterson ............... C03B 11/084 501/93 |
| 2014/0315392 | A1 | 10/2014 | Xu et al. |

FOREIGN PATENT DOCUMENTS

| | | |
|---|---|---|
| JP | H8-236599 A | 9/1996 |
| JP | 2001-135619 A | 5/2001 |
| JP | 2018-107433 A | 7/2018 |
| JP | 2019-504470 A | 2/2019 |
| KR | 101849038 B1 * | 4/2018 |
| WO | WO 2017-087474 A1 | 5/2017 |

* cited by examiner

MEMBER FOR PLASMA PROCESSING APPARATUS, PLASMA PROCESSING APPARATUS WITH THE SAME AND METHOD FOR USING SINTERED BODY

PRIORITY

This application is a United States Application which claims priority to JP Application No. 2019-072008, filed on Apr. 4, 2019, which is incorporated verbatim herein by reference in its entirety, including the specification, drawings, and the claims.

TECHNICAL FIELD

The present disclosure relates to a member for a plasma processing apparatus, a plasma processing apparatus provided with the member, and a method for using a sintered body.

BACKGROUND

A member which is provided in a chamber of a plasma etching apparatus or the like in manufacture of a semiconductor is exposed to an erosion environment due to plasma of an etching gas which is used in a semiconductor pattern formation or the like. If such a member is made of a material that reacts with an etchant, it contaminates the inside of the chamber and an etching processing object (for example, a semiconductor wafer), causing insulation failure and shape failure. In order to suppress such a phenomenon, use of silicon (Si) or quartz as the member has been studied.

For example, Japanese Unexamined Patent Publication No. 2001-135619 proposes an edge ring made of single-crystal silicon in order to prevent contamination by impurities such as heavy metal. Japanese Unexamined Patent Publication No. 62-047130 proposes to use SiC, WC, TiC, or the like as a material of a wafer ring. In Japanese Unexamined Patent Publication No. 2018-107433, SiC, Si, $SiO_2$, W, WC, and the like are mentioned as materials of an edge ring. In addition to these materials, there are also known members obtained by spraying yttrium oxide having high corrosion resistance onto aluminum or an aluminum alloy which is inexpensive and is easily manufactured, alumite-treated aluminum, or a base material such as aluminum.

SUMMARY

However, among the materials described above, aluminum does not have sufficient corrosion resistance to plasma, and there is a concern that the frequency of replacement of members due to consumption may increase. Although it is conceivable to provide a corrosion-resistant layer as a countermeasure, if the corrosion-resistant layer is provided, the generation of particles or the like is a concern. Further, metal ions such as aluminum and yttrium adversely affect a semiconductor circuit and can cause malfunction and operation failure.

Since silicon and quartz are also easily eroded by plasma, the frequency of replacement of members increases. Further, among ceramics, tungsten carbide (WC) is an excellent material that has high strength and has high conductivity, so that static electricity is also not easily generated. However, WC itself has a high melting point and is a hardly sinterable material, and thus it is relatively difficult to obtain a sintered body having few pores serving as particle pockets. In a so-called cemented carbide obtained by adding a certain amount of a metal binder such as Co or Ni to WC, it is possible to reduce pores, there is a concern that a metal binder component such as Co or Ni may contaminate the inside of the chamber of the plasma processing apparatus and serve as a factor of particle generation. Such metal contamination easily occurs particularly in a case where the metal component is contained as a "phase". This is because an etching rate to a plasma gas is different between a carbide phase and a metal phase, and in the case of the metal phase, a metal portion is preferentially corroded and a large amount of pollutant metal is released.

Therefore, the present disclosure provides a member for a plasma processing apparatus, which has excellent corrosion resistance to plasma processing, and in which it is possible to sufficiently suppress metal contamination of the inside of the plasma processing apparatus. Further, the present disclosure provides a plasma processing apparatus which has excellent corrosion resistance and in which it is possible to sufficiently suppress metal contamination of the inside of the apparatus. Further, the present disclosure provides a method for using a sintered body which has excellent corrosion resistance to plasma processing and in which it is possible to sufficiently suppress metal contamination of the inside of a plasma processing apparatus, as a member of the plasma processing apparatus.

According to an aspect, the present disclosure provides a member (sintered body) for a plasma processing apparatus, which has a tungsten carbide phase and a sub-phase dispersed in the tungsten carbide phase and including at least one selected from the group consisting of the following phase I, phase II, phase III, phase IV, and phase V, in which the content ratio of the tungsten carbide phase is 99% by volume or more, the content ratio of the sub-phase is 1% by volume or less, and a porosity is 2% by volume or less.

Phase I: a carbide phase containing, as a constituent element, at least one of elements of Group IV, Group V, and Group VI of the periodic table excluding W Phase II: a nitride phase containing, as a constituent element, at least one of elements of Group IV, Group V, and Group VI of the periodic table excluding W Phase III: a carbonitride phase containing, as a constituent element, at least one of the elements of Group IV, Group V, and Group VI of the periodic table excluding W Phase IV: a carbon phase Phase V: a composite carbide phase which is represented by a formula $W_xM_yC_z$ (where M represents an iron group element, C represents carbon, W represents tungsten, and x, y, and z each independently represent a numerical value exceeding 0)

The above member has excellent corrosion resistance to plasma processing, because the content ratio of the tungsten carbide phase is 99% by volume or more. Further, since the porosity is 2% by volume or less, particle pockets associated with the plasma processing can be reduced. Further, since the content ratio of the tungsten carbide phase is high, the sub-phase is a component having relatively excellent corrosion resistance to plasma, and the content ratio of the sub-phase is 1% by volume or less, the contamination of the inside of the plasma processing apparatus can be sufficiently suppressed.

According to another aspect, the present disclosure provides a plasma processing apparatus including the member described above. This plasma processing apparatus includes the above member. For this reason, it is possible to provide a plasma processing apparatus which has excellent corrosion resistance and in which it is possible to sufficiently suppress contamination of the inside of the apparatus.

According to still another aspect, the present disclosure provides a method for using a sintered body as a member of a plasma processing apparatus, in which the sintered body has a tungsten carbide phase and a sub-phase dispersed in the tungsten carbide phase and including at least one selected from the group consisting of the following phase I, phase II, phase III, phase IV, and phase V, the content ratio of the tungsten carbide phase is 99% by volume or more, the content ratio of the sub-phase is 1% by volume or less, and a porosity is 2% by volume or less.

Phase I: a carbide phase containing, as a constituent element, at least one of elements of Group IV, Group V, and Group VI of the periodic table excluding W Phase II: a nitride phase containing, as a constituent element, at least one of elements of Group IV, Group V, and Group VI of the periodic table excluding W Phase III: a carbonitride phase containing, as a constituent element, at least one of the elements of Group IV, Group V, and Group VI of the periodic table excluding W Phase IV: a carbon phase Phase V: a composite carbide phase which is represented by a formula $W_xM_yC_z$ (where M represents an iron group element, C represents carbon, W represents tungsten, and x, y, and z each independently represent a numerical value exceeding 0)

The present disclosure can provide a member for a plasma processing apparatus, which has excellent corrosion resistance to plasma processing, and in which it is possible to sufficiently suppress metal contamination of the inside of the plasma processing apparatus. Further, it is possible to provide a plasma processing apparatus which is excellent in corrosion resistance and in which it is possible to sufficiently suppress metal contamination of the inside of the apparatus. Further, it is possible to provide a method for using a sintered body which has excellent corrosion resistance to plasma processing and in which it is possible to sufficiently suppress metal contamination of the inside of a plasma processing apparatus, as a member of the plasma processing apparatus.

DETAILED DESCRIPTION

Hereinafter, an embodiment of the present disclosure will be described with reference to the drawings as necessary. However, the following embodiment is exemplification for describing the present disclosure and is not intended to limit the present disclosure to the following contents.

A member for a plasma processing apparatus according to an embodiment of the present disclosure is made of a sintered body and has a tungsten carbide phase and a sub-phase dispersed in the tungsten carbide phase. The sub-phase is composed of at least one phase selected from the group consisting of the following phases I, II, III, IV, and V. The content ratio of the tungsten carbide phase in the member is 99% by volume or more, and the total content ratio of the sub-phases in the member, that is, the phase I, the phase II, the phase III, the phase IV, and the phase V, is 1% by volume or less. Further, the porosity in the member is 2% by volume or less.

Phase I: a carbide phase containing, as a constituent element, at least one of the elements of Group IV, Group V, and Group VI of the periodic table excluding W Phase II: a nitride phase containing, as a constituent element, at least one of the elements of Group IV, Group V, and Group VI of the periodic table excluding W Phase III: a carbonitride phase containing, as a constituent element, at least one of the elements of Group IV, Group V, and Group VI of the periodic table excluding W Phase IV: a carbon phase Phase V: a composite carbide phase which is represented by a formula $W_xM_yC_z$ (where M represents an iron group element, C represents carbon, W represents tungsten, and x, y, and z each independently represent a numerical value exceeding 0)

The tungsten carbide phase in the present disclosure is a crystal phase of tungsten carbide. From the viewpoint of sufficiently reducing metal contamination while reducing the manufacturing cost of the member, the content ratio of the tungsten carbide phase may be in a range of 99.3 to 99.99% by volume, or may be in a range of 99.5 to 99.95% by volume. The sub-phase is a crystal phase of at least one selected from the group consisting of the phase I, the phase II, the phase III, the phase IV, and the phase V described above. The content ratio of the sub-phase in the member may be in a range of 0.01 to 0.7% by volume, or may be in a range of 0.05 to 0.5% by volume, from the viewpoint of sufficiently reducing metal contamination while reducing the manufacturing cost of the member. The volume ratio of each phase can be determined by performing image processing on an image of a scanning electron microscope.

A trace amount of impurities may be dissolved in the tungsten carbide phase and the sub-phase. The content of each of a Fe atom, a Co atom, and a Ni atom in the member may be in a range of 30 to 3300 atomic ppm, or may be in a range of 30 to 1650 atomic ppm. By containing the iron group element in such a range, it is possible to sufficiently reduce metal contamination while reducing the manufacturing cost of the member. The content of each atom can be measured by glow discharge mass spectrometry (GDMS).

The porosity of the member may be in a range of 0.05 to 1% by volume or may be in a range of 0.1 to 0.5% by volume, from the viewpoint of reducing the manufacturing cost while sufficiently reducing particle pockets. The porosity can be calculated from the relative density obtained by the Archimedes method.

Titanium (Ti), vanadium (V), chromium (Cr), zirconium (Zr), Niobium (Nb), molybdenum (Mo), hafnium (Hf), and tantalum (Ta) are included in the "elements of Groups IV, V, and VI of the periodic table excluding W" in the phase I, the phase II, and the phase III.

The "elements of Groups IV, V, and VI of the periodic table excluding W" in the phase I, the phase II, and the phase III may be one or two or more elements selected from the group consisting of Ta, Nb, V, and Cr. By including carbides of these, it is possible to increase the mechanical strength. Further, the effect of suppressing abnormal grain growth of the tungsten carbide phase (WC phase) is increased, and thus it is possible to suppress large-sized particle pockets. Further, if the number of particles increases, the effect of suppressing the abnormal grain growth of the tungsten carbide phase (WC phase) increases, and thus it is possible to suppress large-sized particle pockets.

The "carbon phase" in the phase IV may be one or two or more substances selected from the group consisting of graphite, amorphous carbon, tubular carbon such as carbon nanotube (CNT), and thin plate-shaped carbon such as graphene.

The iron group element "M" in the phase V is one or two or more elements selected from the group consisting of iron (Fe), cobalt (Co), and nickel (Ni). The "composite carbide phase" of the phase V is a composite carbide of tungsten (W) and an iron group element, and for example, a $W_3Co_3C$ phase and a $W_3Ni_3C$ phase can be given. The content ratio of the composite carbide phase may be 0.5% by volume or less from the viewpoint of maintaining sufficiently high resistance to the plasma processing.

The carbide, the nitride, and the carbonitride of the phases I to III have the effect of suppressing abnormal grain growth of tungsten carbide (WC). At least a part of the carbide, the nitride, and the carbonitride is dissolved in tungsten carbide and has the effect of promoting sintering. Further, by including the carbide, the nitride, and the carbonitride of the phases I to III, it is possible to further increase the mechanical strength. Thus, it is also possible to cope with a member having a shape in which strength becomes problematic when made of silicon, for example. The carbide, the nitride, and the carbonitride of the phases I to III are as high as tungsten carbide in terms of corrosion resistance. For this reason, it is possible to sufficiently suppress the generation of particle pockets. Each of the carbide phase of the phase I, the nitride phase of the phase II, and the carbonitride phase of the phase III may be one type or two or more types. For example, the phase I may be a composite carbide phase (different from the phase V) such as (Ti.Mo)C. The phase III may be a composite carbonitride phase such as (Ti.Mo)(C.N).

The carbon phase of the phase IV has the effect of promoting the sintering of tungsten carbide. The carbon phase has a higher plasma etching rate than the tungsten carbide phase. However, by reducing the average particle diameter of powder which is used as a raw material and adjusting sintering conditions, the phase IV can be included in the member with fineness and high dispersibility. In this way, it is possible to sufficiently suppress the generation of particles. Further, since only carbon (C) is used as a component, metal contamination can be prevented.

The composite carbide of W and an iron group (M), which is represented by a formula $W_xM_yC_z$ of the phase V, can be generated during sintering of tungsten carbide. As a representative composition, a composition of x=3, y=3, z=1 is exemplified. As another composition, a composition of x=4, y=2, z=1 may be adopted, and a composition of x=6, y=3, z=2 may be adopted. The composition is not limited to these. Although the composite carbide has slightly lower corrosion resistance than the tungsten carbide phase, the composite carbide has the effect of promoting sintering. For this reason, it is possible to obtain a sintered body having few pores and hardly generating particle pockets.

Even if the sub-phase is any one of the phases I to V, it is possible to reduce the pores and improve the mechanical properties, as compared with a member composed of a single tungsten carbide (tungsten carbide phase: 100% by volume). Further, it is possible to sufficiently reduce the effects of an increase in the plasma etching rate, an increase in metal contamination, an increase in particle pockets, and the like.

The "corrosion resistance" in the present disclosure means corrosion resistance to plasma processing using a fluorocarbon-based or halogen-based etching gas or the like.

The member may not include phases other than the tungsten carbide phase and the sub-phase. For example, the member may not include a metal phase (a phase of metal or an alloy, which is not subjected to carbonization or the like) and may be consisting of a tungsten carbide phase and a sub-phase of at least one selected from the group consisting of the phases I to V. However, the tungsten carbide phase and the sub-phase may include a trace amount of impurities such as metal atoms. The content of a single metal with respect to the entire member may be, for example, 3300 atomic ppm or less, 1650 atomic ppm or less, or 1000 atomic ppm or less, from the viewpoint of contamination suppression. If a metal phase is included, the portion is preferentially subjected to plasma etching, and irregularities are generated on the surface of the member, which tend to become particle pockets. Further, the metal phase is plasma-etched, and the metal ions float and tend to become contamination sources of an etching processing object such as a semiconductor wafer.

The total content of the iron group elements (Fe atoms, Co atoms, and Ni atoms) in the member may be in a range of 30 to 3300 atomic ppm. The iron group element has the effect of promoting sintering of tungsten carbide. If the total content of the iron group elements is less than 30 atomic ppm, the effect of promoting sintering tends to become weak. On the other hand, if the total content of the iron group elements exceeds 3300 atomic ppm, a fine phase of the iron group metal tends to appear in a part of the sintered body. From the viewpoint of sufficiently reducing the amount of particles generated during the plasma processing, the total amount (mol) of the iron group elements in the member may be in a range of 30 to 2200 ppm or may be in a range of 30 to 1650 ppm.

In the member of the present embodiment, the WC phase having excellent corrosion resistance to the plasma processing accounts for 99% by volume or more. For this reason, the etching rate of the member is extremely low, and the life can be extended as compared with a member made of silicon, for example. In a case where the member does not have a metal phase, there is no phase that is easily corroded by plasma, and thus, it is possible to make it difficult to generate irregularities on the member surface due to a difference in etching rate. For this reason, it is possible to make it difficult to generate particle pockets and to suppress metal contamination. Further, since the sub-phase has the effect of promoting sintering, pores which cause particle pockets in the member can be sufficiently reduced as compared with pure tungsten carbide. By using such a member in a plasma processing apparatus, contamination of an etching processing object and the inside of the apparatus can be reduced, the life of the apparatus can be prolonged, and the quality and yield of manufactured products by a semiconductor manufacturing process can be improved.

When plasma etching is performed by a plasma processing apparatus, there is a case where a material containing tungsten is used as a mask material. In this case, since tungsten is used in the chamber, processing of removing tungsten is performed on the etching processing object. For this reason, contamination caused by the inclusion of tungsten in the member can be removed by the above processing.

An example of a method of manufacturing a member for a plasma processing apparatus will be described below. As raw materials, tungsten carbide powder and powder for producing a sub-phase are prepared. From the viewpoint of sufficiently reducing metal contamination, the purity of the tungsten carbide powder may be 99.5% by mass or more, or may be 99.8% by mass or more. The average particle diameter may be in a range of about 0.1 to 4 µm from the viewpoint of sinterability and handleability.

In a case of forming the phase I, the phase II, or the phase III, as a raw material, powder of carbide, nitride, or carbonitride containing, as a constituent element, at least one of the element of Groups IV, V, and VI of the periodic table excluding W may be used. These have the effect of suppressing abnormal grain growth of a sintered body. Since the etching rate is different from that of WC, from the viewpoint of suppressing the generation of irregularities and reducing particle pockets, the average particle diameter of the powder may be 1 µm or less, may be 0.8 µm or less, or may be 0.6 µm or less.

In a case of forming the phase IV, one or two or more selected from the group consisting of graphite, amorphous carbon, and tubular carbon such as CNT are added. The carbon source may be fibrous carbon or laminar carbon, or may be resin. In a case where graphite is added, powder having an average particle diameter in a range of about 0.5 to 5 µm may be used. Since the carbon component exchanges carbon with WC during sintering, the particle diameter of the raw material does not always coincide with the particle diameter of the carbon phase in the sintered body. With respect to amorphous carbon and tubular carbon such as CNT, the average particle diameter may be 1 µm or less. In a case where the raw material is anisotropic, the long side thereof may be 1 µm or less.

In a case of forming the phase V, iron group metal powder or powder of a compound containing an iron group as a constituent element can be used. The compound may be made into an aqueous solution or the like and mixed in an ionic state. In this manner, the form of the raw material is not particularly limited. Further, an iron group metal (Fe, Ni, Co) may be mixed from a medium in a mixing and stirring step to be described later. The compounding amount of the iron group with respect to the entire raw material may be 200 ppm or more on a mass basis. The average particle diameter of the powder may be in a range of about 0.5 to 4 µm. If the average particle diameter is excessively large, the iron group metal phase tends to easily remain in the sintered body. Further, when the tungsten carbide powder is represented by the composition formula of $W_1C_{1-x}$, the phase V is easily formed by using powder in which the value of x is large (for example, $0.05 \le x \le 0.2$). Further, by mixing the WC powder with the iron group metal powder or the powder of the compound containing an iron group element as a constituent element for a long time and taking in oxygen in the air, the phase V is easily formed. This is because decarburization tends to occur during sintering. Further, from the viewpoint of easily causing decarburization, a firing temperature may be set higher.

The raw materials described above are mixed and stirred by a known dry type or wet type method. The obtained mixed powder may be dried as necessary, or mixed powder may be obtained by adding an organic binder for molding. Subsequently, the mixed powder is subjected to pressure molding to obtain a molded body. The pressure molding may be performed using a mold and a press machine, or a wet type press machine using hydrostatic pressure may be used. The maximum pressurization at the time of pressing can be performed in a range of about 10 to 500 MPa. If necessary, degreasing, temporary sintering, and intermediate processing can be performed on the obtained molded body.

The molded body or a treated body subjected to degreasing, calcination, and intermediate processing is put in a sintering furnace and sintered. The sintering can be performed in a non-oxidizing atmosphere (a hydrogen gas atmosphere, an ammonia gas atmosphere, a vacuum atmosphere with carbon interposed, a rare gas atmosphere, or the like). The maximum temperature during the sintering may be in a range of about 1800 to 2400° C. because tungsten carbide is a hardly sinterable material.

After the sintering, the sintered body may be subjected to HIP (Hot Isostatic Pressing) treatment to further reduce residual pores. Further, in the case of uses and shapes that require dimensional accuracy, the sintered body may be subjected to various known surface treatments such as machining and electric machining. In this way, a member for a plasma processing apparatus, which is configured with a sintered body, is obtained. The method of manufacturing the member is not limited to the example described above, and a hot press method or an SPS method (spark plasma sintering method) may be used depending on the shape.

There is a case where tungsten carbide partially reacts at a high temperature during sintering. For this reason, the volume ratio of the input raw material and the volume ratio of the phase in the member do not always coincide with each other. This is based on various factors such as the fact that tungsten carbide is not originally a compound having an ideal $W_1C_1$ ratio (the stoichiometric ratio of C is less than 1 with respect to the stoichiometric ratio of W, which is 1), the fact that solid solution of tungsten carbide and other carbides (or nitrides and carbonitrides) can occur, the fact that exchange of carbon between tungsten carbide and a carbon source other than tungsten carbide (for example, firing atmosphere, firing jig, or the like) occurs, and the fact that an iron group and tungsten produces composite carbide as a compound.

In the state after the sintering, the ratio of phases other than the tungsten carbide phase in the member for a plasma processing apparatus is 1% by volume or less in total. The input raw materials and the sintering conditions may be set such that the ratio of phases other than the tungsten carbide phase in the sintered body is reduced.

Since the sintered body described above has sufficient corrosion resistance to plasma processing, the life of the member can be extended, and the generation of particle pockets and the metal contamination can be sufficiently suppressed. Further, the sintered body described above has conductivity. For this reason, the sintered body can be suitably used as a member for a plasma processing apparatus which is used in a semiconductor manufacturing process. As specific members, an edge ring which is installed around a semiconductor wafer, an electrostatic chuck for attracting a semiconductor, a base material for placing a wafer, a shower plate serving as a process gas supply part for etching, a stem of a water jacket part with a structure in which cooling water flow, an inner wall material of a chamber, and the like can be given as examples.

The sub-phase of the member may be the phase V, and the composite carbide phase may contain one or both of a $W_3Co_3C$ phase and a $W_3Ni_3C$ phase.

The sub-phase of the member may be at least one selected from the group consisting of the phase I, the phase II, and the phase III, and the constituent element in the phase I, the phase II, and the phase III may include at least one selected from the group consisting of Cr, Ta, V, and Nb. In this way, the effect of suppressing abnormal grain growth is increased, and large-sized particle pockets can be suppressed.

The member may be consisting of a tungsten carbide phase and a carbide phase (phase I). In this way, sinterability can be improved and pores can be reduced. Further, the mechanical strength is improved, so that it can be applied to fragile shape application members.

The member may be consisting of a tungsten carbide phase and a carbon phase (phase IV). In this way, sinterability can be improved and pores can be reduced. Further, a processing load can be reduced and processing can be performed at low cost, as compared with the case where there is no phase IV.

The member may be consisting of a tungsten carbide phase and a composite carbide phase (phase V). In this way, sinterability can be improved and pores can be reduced. Further, the allowable range of the amount of impurities in the raw material or the firing conditions is wide, and thus the member is easily manufactured at low cost.

The member may be consisting of a tungsten carbide phase, a carbide phase (phase I), and a composite carbide phase (phase V). In this way, the benefits of both the phase I and the phase V are obtained.

Figure 1:
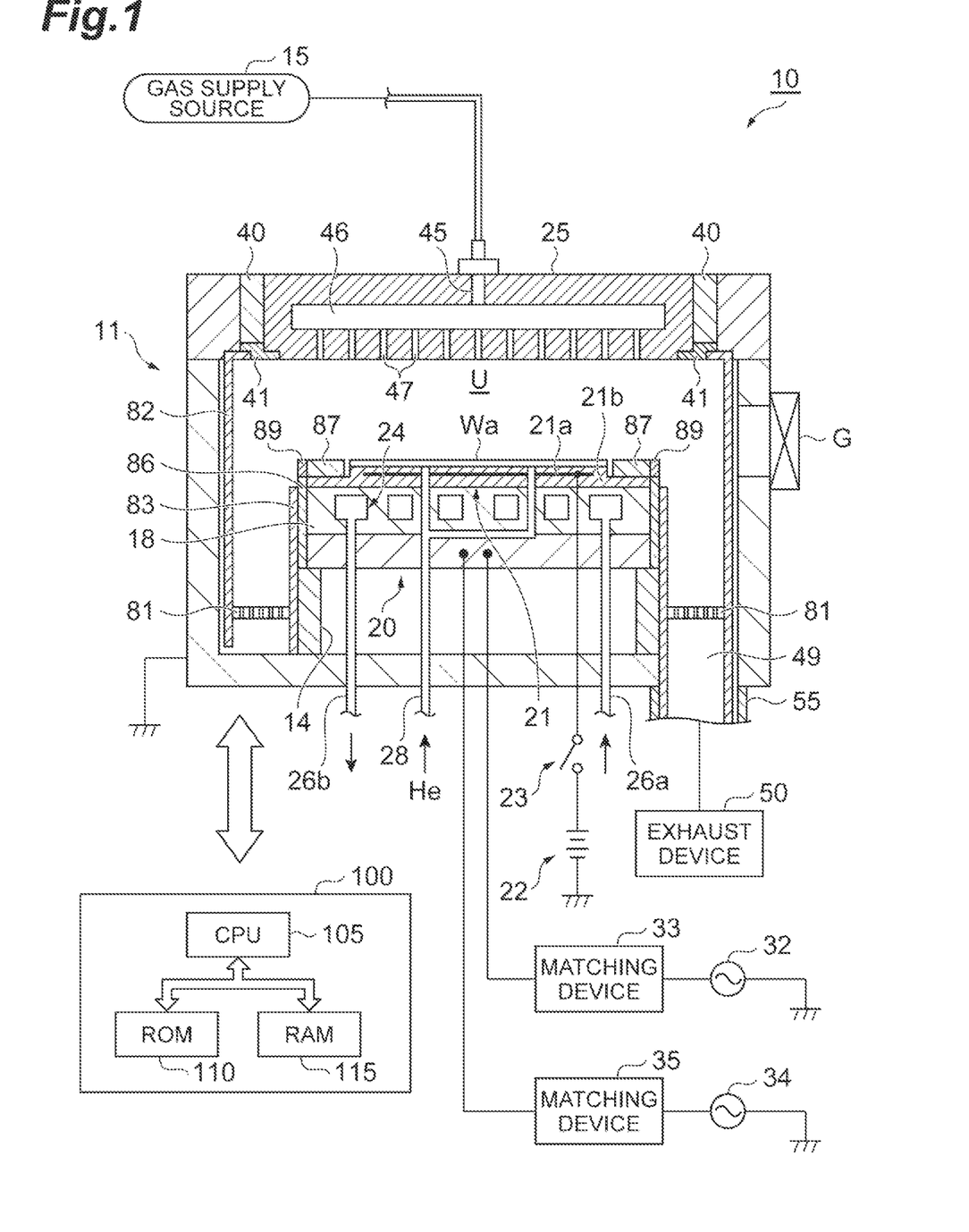
FIG. 1 is a schematic sectional view showing an embodiment of a plasma processing apparatus.

FIG. 1 is a longitudinal sectional view showing an example of a plasma processing apparatus 10 according to an embodiment. The plasma processing apparatus 10 of the present embodiment is a capacitively coupled (CCP: Capacitively Coupled Plasma) parallel plate plasma processing apparatus. In the plasma processing apparatus 10, a gas is converted into plasma in a chamber 11, and a wafer Wa placed on a placing table 20 is processed by the action of the plasma. The wafer Wa is, for example, a semiconductor wafer. The plasma processing apparatus 10 is an example of a processing apparatus.

The plasma processing apparatus 10 has a substantially cylindrical chamber 11. The inner surface of the chamber 11 is subjected to alumite treatment (anodizing treatment). A processing chamber U in which plasma etching processing, film formation processing, and the like are performed on the wafer Wa is defined in the chamber 11.

The placing table 20 has a base 18 and an electrostatic chuck 21 and the wafer Wa is placed thereon. The placing table 20 also functions as a lower electrode.

The electrostatic chuck 21 is provided on the base 18. The electrostatic chuck 21 has a structure in which a chuck electrode 21a is interposed between insulators 21b. A direct-current power source 22 is connected to the chuck electrode 21a through a switch 23, and when the switch 23 is turned on, a direct-current voltage is applied from the direct-current power source 22 to the chuck electrode 21a. In this way, the wafer Wa is attracted to the electrostatic chuck 21 by a Coulomb force.

An annular edge ring 87 is placed on a placing surface of the outer periphery of the electrostatic chuck 21 around the wafer Wa. The edge ring 87 is also called a focus ring, and functions to converge the plasma in the processing chamber U toward the surface of the wafer Wa and to improve the efficiency of the plasma processing.

The placing table 20 is held on a bottom portion of the chamber 11 by a support 14. A refrigerant flow path 24 is formed in the interior of the base 18. A cooling medium such as cooling water and brine, for example, which is output from a chiller unit, flows through a refrigerant inlet pipe 26a, the refrigerant flow path 24, and a refrigerant outlet pipe 26b, returns to the chiller unit, is controlled to a predetermined temperature, and circulates through the path described above. In this way, the placing table 20 is radiated in heat and cooled.

A heat transfer gas such as helium gas (He) which is supplied from a heat transfer gas supply source is supplied to the gap between the placing surface of the electrostatic chuck 21 and the back surface of the wafer Wa through a gas supply line 28. The temperature of the wafer Wa is controlled to a predetermined temperature by the cooling medium circulating through the refrigerant flow path 24 and the heat transfer gas which is supplied to the back surface of the wafer Wa.

A first radio frequency power source 32 is electrically connected to the placing table 20 through a first matching device 33 and applies radio frequency power for plasma generation HF having a first frequency (for example, 40 MHz) to the placing table 20. Further, a second radio frequency power source 34 is electrically connected to the placing table 20 through a second matching device 35 and applies radio frequency power for bias voltage generation LF having a second frequency (for example, 13.56 MHz) lower than the first frequency to the placing table 20.

The first matching device 33 matches the load impedance on the plasma side with the internal impedance of the first radio frequency power source 32. The second matching device 35 matches the load impedance on the plasma side with the internal impedance of the second radio frequency power source 34.

A gas shower head 25 is mounted to close an opening of a ceiling portion of the chamber 11 through a cylindrical shield ring 40 provided at an outer edge thereof. The gas shower head 25 also functions as a counter electrode (an upper electrode) facing the placing table 20 (the lower electrode). A top shield ring 41 is disposed on the lower surface of the shield ring 40 at a peripheral portion of the gas shower head 25.

A gas introduction port 45 for introducing a gas is formed in the gas shower head 25. A diffusion chamber 46 is provided in the interior of the gas shower head 25. A gas output from a gas supply source 15 is supplied to the diffusion chamber 46 through the gas introduction port 45, is diffused in the diffusion chamber 46, and is introduced from a plurality of gas supply holes 47 into the processing chamber U in the chamber 11.

An exhaust port 55 is formed on the bottom surface of the chamber 11, and the inside of the chamber 11 is exhausted by an exhaust device 50 connected to the exhaust port 55. In this way, the inside of the chamber 11 can be maintained at a predetermined degree of vacuum. A gate valve G is provided on the side wall of the chamber 11, and the wafer Wa is transferred from a transfer port into the chamber 11 or out of the chamber 11 by opening and closing the gate valve G.

A cylindrical insulator ring 86 is disposed to cover the outer peripheral side surface of the placing table 20. Further, a cylindrical cover ring 89 is disposed to cover the outer peripheral side surface of the edge ring 87.

A deposit shield 82 is provided along the inner wall surface at the side portion of the chamber 11. Further, a deposit shield 83 is provided along the outer peripheral side surfaces of the placing table 20 and the support 14. The deposit shields 82 and 83 are configured to be detachable. The deposit shields 82 and 83 prevent by-products (deposits) generated by plasma etching processing or the like executed in the chamber 11 from adhering to the inner wall of the chamber 11.

An annular baffle plate 81 is provided in an annular exhaust path between the deposit shields 82 and 83. The exhaust port 55 is provided in an exhaust path 49 below the baffle plate 81.

The plasma processing apparatus 10 is provided with a control unit 100 for controlling the operation of the entire apparatus. The control unit 100 has a CPU (Central Processing Unit) 105, a ROM (Read Only Memory) 110, and a RAM (Random Access Memory) 115. The CPU 105 executes desired plasma processing such as etching according to a recipe stored in a storage area such as the RAM 115. A process time, pressure (gas exhaust), radio frequency power or voltage, various gas flow rates, a temperature in a chamber, a cooling medium temperature, and the like, which are control information of the apparatus with respect to process conditions, are set in the recipe.

When the plasma processing is executed, the opening and closing of the gate valve G is controlled, and the wafer Wa is loaded into the chamber 11 and placed on the placing table 20. If a direct-current voltage is applied from the direct-current power source 22 to the chuck electrode 21a, the wafer Wa is attracted to and held by the electrostatic chuck 21.

The processing gas is supplied from the gas supply source 15 into the chamber 11. The radio frequency power HF is applied from the first radio frequency power source 32 to the placing table 20, and the radio frequency power LF is applied from the second radio frequency power source 34 to the placing table 20. In this way, plasma is generated in the processing chamber U, and plasma processing is performed on the wafer Wa by the action of the plasma.

After the plasma processing, a direct-current voltage having a polarity reverse to the polarity when attracting the wafer Wa is applied from the direct-current power source 22 to the chuck electrode 21a and the charges of the wafer Wa are eliminated. In this way, the wafer Wa is peeled off from the electrostatic chuck 21 and is unloaded to the outside of the chamber 11 through the gate valve G.

In the plasma processing apparatus 10, each component which is exposed to the plasma processing may be configured with the member according to the embodiment described above. For example, at least one selected from the group consisting of the edge ring 87, the cover ring 89, the baffle plate 81, the gas shower head 25, the top shield ring 41, the deposit shield 82, and the deposit shield 83 may be configured with the member (sintered body) described above. The plasma processing apparatus is not limited to that shown in FIG. 1, and the member described above can be used in various semiconductor manufacturing apparatuses that perform plasma processing. The component to which the member is applied is also not particularly limited, and may be applied to, for example, a shower plate, a base, an inner wall of a processing container, and the like. By using the above-described sintered body in the plasma processing apparatus, it is possible to improve the corrosion resistance of the component of the plasma processing apparatus 10 and to sufficiently suppress the metal contamination of the etching processing object such as the wafer Wa and the inside of the apparatus.

In another aspect, the above-described embodiment can be a method for using the sintered body as a member of a plasma processing apparatus. An embodiment of the present disclosure has been described above. However, the present disclosure is not limited to the above embodiment.

Example

The contents of the present invention will be described in more detail with reference to examples and comparative examples. However, the present invention is not limited to the examples described below.

Examples 1 to 20

[Fabrication of Sintered Body]
Commercially available WC powder (average particle diameter: 0.6 μm) was prepared. The WC powder, a raw material for forming the sub-phase, and methanol were put in a binderless cemented carbide lining pot and pulverized by a ball mill (rotational speed: 64 rpm) to prepare mixed powder. As the ball of the ball mill, a ball made of a binderless cemented carbide was used. The mixed powder was put in a mold having a predetermined size, and pressed at 100 MPa by using a press machine to fabricate a molded body. The molded body was fired at 2200° C. for 2 hours under vacuum. This temperature is close to the upper limit of a vacuum sintering temperature at which industrial mass production is possible. Thereafter, HIP treatment was performed under the conditions of 1700° C. and 200 MPa to obtain sintered bodies of Examples 1 to 20.

Table 1 summarizes the compositions and porosity of the sintered bodies of the examples. The volume ratio of the tungsten carbide phase in Table 1 is a value obtained by subtracting the content ratio of the sub-phase in Table 1 from the whole (100%). The volume ratio of the tungsten carbide phase in each of the sintered bodies of Examples 1 to 20 was 99% by volume or more.

In the sintered bodies of Examples 1 to 6, the carbide phase (phase I), the nitride phase (phase II), or the carbonitride phase (phase III) containing the elements of Groups IV to VI of the periodic table as a constituent element was dispersed in the tungsten carbide phase at a ratio of 1% by volume or less. In Examples 1 to 4, $Cr_3C_2$ powder, TiC powder, TiN powder, VC powder, or TaC powder was used as a raw material for forming the sub-phase. In Examples 5 and 6, ZrN powder and Ti (C N) powder were respectively used as raw materials for forming the sub-phase.

The identification of the sub-phase in each sintered body was performed using EDX (energy dispersion type X-ray analysis). Further, the volume ratio of the sub-phase was determined by observing the cross section of the sintered body with a scanning electron microscope (SEM) and performing image analysis based on a difference in color tone. Each sintered body was subjected to lap processing after polishing, and the porosity was determined from a scanning electron microscope image. As a result, the porosity of each of the sintered bodies of Examples 1 to 20 was 0.5% by volume or less.

In the sintered bodies of Examples 7 to 12, the composite carbide phase (phase V) containing W, an iron group, and carbon as a constituent element was dispersed in the tungsten carbide phase. In the sintered bodies of Examples 18 to 20, the carbide phase (phase I), the nitride phase (phase II), or the carbonitride phase (phase III) containing the elements of Groups IV to VI of the periodic table as a constituent element was further dispersed.

In the sintered bodies of Examples 13 to 16, the carbon phase (phase IV) was dispersed in the tungsten carbide phase. As the carbon phase, graphite or carbon nanotube used as a raw material was included.

The sintered body of Example 17 included the carbide phase (TaC) in addition to the carbon phase. This sintered body was fabricated using WC powder, graphite powder, and TaC powder as raw materials. The sintered bodies of Examples 18 to 20 included the carbide phase (phase I) and the composite carbide phase (phase V).

TABLE 1

|  | Composition of sintered body (numerical value in parentheses is volume ratio) | Content ratio of sub-phase % by volume | Porosity % by volume |
|---|---|---|---|
| Example 1 | WC—$Cr_3C_2$(0.1%) | 0.1 | ≤0.5 |
| Example 2 | WC—TiC(0.1%)—TiN(0.1%) | 0.2 | ≤0.5 |
| Example 3 | WC—$Cr_3C_2$(0.1%)—VC(0.01%) | 0.11 | ≤0.5 |
| Example 4 | WC—TiC(0.8%)—TaC(0.2%) | 1 | ≤0.5 |
| Example 5 | WC—ZrN(0.3%) | 0.3 | ≤0.5 |
| Example 6 | WC—Ti(C•N)(0.2%) | 0.2 | ≤0.5 |
| Example 7 | WC—$W_3Co_3C$(0.01%) | 0.01 | ≤0.5 |
| Example 8 | WC—$W_3Co_3C$(0.03%) | 0.03 | ≤0.5 |
| Example 9 | WC—$W_3Co_3C$(0.1%) | 0.1 | ≤0.5 |
| Example 10 | WC—$W_3Ni_3C$(0.01%) | 0.01 | ≤0.5 |
| Example 11 | WC—$W_3Ni_3C$(0.03%) | 0.03 | ≤0.5 |
| Example 12 | WC—$W_3Ni_3C$(0.1%) | 0.1 | ≤0.5 |
| Example 13 | WC-graphite(0.5%) | 0.5 | ≤0.5 |
| Example 14 | WC-graphite(1%) | 1 | ≤0.5 |
| Example 15 | WC-carbon nanotube(0.1%) | 0.1 | ≤0.5 |
| Example 16 | WC-carbon nanotube(0.5%) | 0.5 | ≤0.5 |
| Example 17 | WC—TaC(0.1%)-graphite(0.1%) | 0.1 | ≤0.5 |
| Example 18 | WC—NbC(0.3%)—$W_3Co_3C$(0.1%) | 0.1 | ≤0.5 |
| Example 19 | WC—MoC(0.2%)—$W_3Ni_3C$(0.2%) | 0.2 | ≤0.5 |
| Example 20 | WC—ZrC(0.05%)—$W_3Co_3C$(0.05%) | 0.05 | ≤0.5 |

<Evaluation of Strength>

Each of the sintered bodies of Examples 1 to 20 had conductivity, and the mechanical strength (three-point bending strength) was in a range of 700 to 1800 MPa.

Comparative Examples 1 to 9

Samples (sintered bodies) having compositions shown in Table 2 were fabricated using commercially available powder. Comparative Example 1 is a member made of silicon which is used as various members in the processing container of the plasma processing apparatus. The member made of silicon has low strength and is easily etched by plasma.

The alumina of Comparative Example 2 is harder to be etched than silicon. However, the corrosion resistance to etching is not sufficient. Comparative Example 3 is a member made of tungsten carbide (purity 100%). Tungsten carbide is a hardly sintered body by itself, and when a sintered body was fabricated under the same conditions as those in the examples (that is, a firing temperature close to the industrial upper limit), the relative density was 95.6% (porosity: 4.4% by volume).

Comparative Example 4 is a cemented carbide having a relatively low Co content, which is classified as a low cobalt cemented carbide. Comparative Example 5 is a general cemented carbide containing Co as a binder. This sintered body was fabricated in the same procedure as in Examples 1 to 20 except that Co (20.7% by volume in volume ratio) was added as a binder to commercially available tungsten carbide powder and mixed and the sintering temperature was 1450° C. The ratio of the tungsten carbide phase in the sintered body was 79.3% by volume. The relative density of the sintered body of Comparative Example 5 was almost 100%.

Comparative Example 6 is a general cemented carbide containing Ni as a binder. Comparative Example 7 is a cemented carbide obtained by adding carbide containing the elements of Groups IV to VI of the periodic table as a constituent element to a cemented carbide containing Co as a binder.

In Comparative Example 8, tungsten carbide contains a total of 2.3% by volume of carbide containing the elements of Groups IV to VI of the periodic table as a constituent element. Comparative Example 9 is a test piece in which a thermal spray coating of $Y_2O_3$ was coated on an aluminum base material.

TABLE 2

|  | Composition of sintered body (numerical value in parentheses is volume ratio) | Porosity % by volume |
|---|---|---|
| Comparative Example 1 | Silicon (100%) | ≤0.5 |
| Comparative Example 2 | $Al_2O_3$(100%) | ≤0.5 |
| Comparative Example 3 | WC (100%) | 4.4 |
| Comparative Example 4 | WC—Co(1.5%) | ≤0.5 |
| Comparative Example 5 | WC—Co(20.7%) | ≤0.5 |
| Comparative Example 6 | WC—Ni(7%) | ≤0.5 |
| Comparative Example 7 | WC—Co(5%)—$Cr_3C_2$(0.3%)—VC(0.02%) | ≤0.5 |
| Comparative Example 8 | WC—TiC(2%)—TaC(0.3%) | ≤0.5 |
| Comparative Example 9 | Aluminum + $Y_2O_3$ thermal spray coating | About 5 |

[Evaluation as Member for Plasma Processing Apparatus]
<Plasma Etching Processing>

Figure 2:
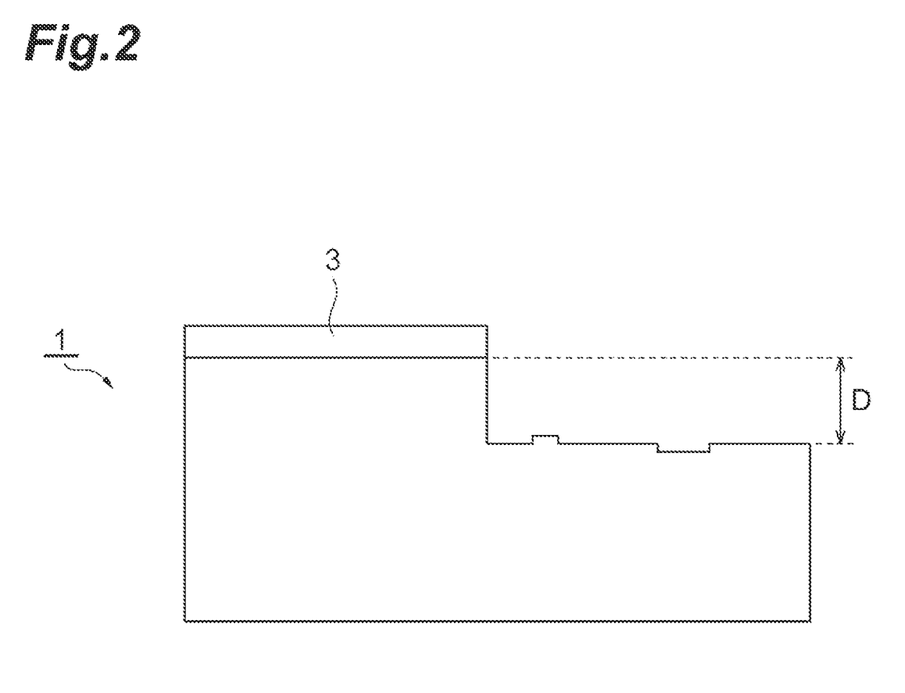
FIG. 2 is a diagram showing an outline of plasma etching processing.

The evaluation of plasma etching of the sintered bodies (members) of each of the examples and each of the comparative examples was performed in the following procedure. The fabricated sintered body was machined to fabricate an evaluation sample having a size of ϕ30 mm×3 mm. The surface of the evaluation sample was mirror-finished. Then, as shown in FIG. 2, a part of the mirror-finished surface of a sintered body 1 was masked with a masking tape 3 made of Kapton, and plasma etching processing was performed using a plasma processing apparatus.

As the plasma processing apparatus, a parallel plate type reactive ion plasma etching apparatus for 8-inch LSI mass production was used. Further, the etching conditions using $CF_4$ gas plasma were a cathode temperature of 60° C., an anode temperature of 30° C., an RF power source output of 1000 W, a gas pressure in chamber of 16 Pa, an etching time of 60 minutes, and a gas flow rate of 60 sccm. As shown in FIG. 2, the unmasked portion of the surface of the sintered body was etched by the plasma etching processing.

<Etching Depth D>

After the plasma etching processing, the masking tape 3 is peeled off from the surface, and a level difference between the non-etched surface and the etched surface was measured using a contour shape measuring instrument (trade name: Surfcom 2800, manufactured by Tokyo Seimitsu Co., Ltd.) to determine an etching depth D.

The etching depths D in Comparative Examples 1 and 2 were 34 μm and 3.6 μm, respectively. In contrast, the etching depths D in Examples 1 to 20 and Comparative Examples 3, 4, 8, and 9 were all within 1.5 μm. It was confirmed that Examples 1 to 20 had better corrosion resistance than Comparative Examples 1 and 2.

<Surface Roughness Change>

The roughness (Ra) of each of the non-etched surfaces and the etched surfaces of the sintered bodies of some examples and some comparative examples was measured to determine a surface roughness change due to the etching. The results were as shown in Table 3. It was suggested that the examples had less irregularities than the comparative examples and that particle pockets could be reduced.

TABLE 3

|  | Non-etched surface Ra (μm) | Etched surface Ra (μm) |
| --- | --- | --- |
| Example 4 | 0.005 | 0.014 |
| Example 7 | 0.006 | 0.055 |
| Comparative Example 1 | 0.004 | 0.332 |
| Comparative Example 2 | 0.007 | 0.262 |
| Comparative Example 5 | 0.005 | 0.199 |

<Number of Particles>

The number of particles after the plasma etching processing was measured using a commercially available particle counter in accordance with JIS B 9921. As a measurement result of the number of particles, the number of particles was about 100 in Comparative Example 1. In contrast, in Examples 1 to 20 and Comparative Example 8, the number of particles ranged from 20 to 100 pieces. In Comparative Examples 3 to 7, the number of particles was more than 100.

In Comparative Example 3, it is considered that the porosity is high, so that pores on the surface become particle pockets, making it easier to hold particles. Comparative Examples 4 to 7 had a metal phase (Co phase or Ni phase) having a size of several μm or more. These metal phases have lower corrosion resistance to plasma than the tungsten carbide phase. For this reason, it is considered that a recess (level difference due to corrosion) is generated between the metal phase and the tungsten carbide phase during the plasma etching processing and this becomes a particle pocket, making it easier to hold a particle. In Comparative Example 9, fine peeling occurred on a part of the surface due to a difference in thermal expansion due to a temperature change.

<Metal Contamination>

The sintered body subjected to the plasma etching was washed with a cleaning solution (hydrofluoric acid). The cleaning solution was analyzed by an ICP-MS method (fusion-coupled plasma mass spectrometry) to evaluate metal contamination. The elements to be analyzed were 13 types of elements; Na, Mg, Al, K, Ca, Ti, Cr, Fe, Co, Ni, Cu, Zn, and W.

In particular, with respect to Cu, Ti, and Ca, which are harmful metal elements that easily contaminate circuits in a semiconductor manufacturing process, samples in which the elements exceed $3 \times 10^{10}$ (atoms/cm$^2$) were determined to be rejected, and with respect to target elements other than Cu, Ti, Ca, and W, samples in which the elements exceed $20 \times 10^{10}$ (atoms/cm$^2$) were determined to be rejected. With respect to W, it was the same as the metal mask component, and had little effect because it was removed in a process in the subsequent step, and thus it was excluded from the evaluation of metal contamination.

The evaluation results of Examples 1 to 20 and Comparative Examples 1, 2, 3, and 9 passed based on the above criteria. With respect to Comparative Examples 4, 5, 6, and 7, a large amount of Co or Ni was detected, and thus the samples were rejected. With respect to Comparative Example 8, the amount of Ti was large, and thus it was rejected.

Summarizing the above results, in Examples 1 to 20, the etching depth D was sufficiently small, and the number of observed particles was equal to or less than that in Comparative Example 1. Further, the metal contamination was equal to or less than the allowable value. Further, all samples had conductivity, and no peeling occurred in any of the evaluations. On the other hand, in Comparative Example 1, although there was no problem in conductivity, there was a problem in processing into a desired shape due to low strength. Further, the etching depth D was the largest, and the corrosion resistance was insufficient.

In Comparative Example 2, the etching depth D was improved as compared with Comparative Example 1. However, the etching depth D was larger than in Examples 1 to 20. Further, since Comparative Example 2 did not have conductivity, particles tended to be generated by an electrostatic discharge.

In Comparative Example 3, the number of particles could not be sufficiently reduced even by washing. This is considered that a large number of pores existing on the surface and in the interior served as particle pockets.

Comparative Examples 4, 5, and 6 had metal phases such as Co and Ni. It is considered that the metal phase is preferentially etched to generate irregularities, which causes the particle pockets. Further, in the metal contamination, the amounts of Co and Ni greatly exceeded the allowable range. Comparative Example 7 was similar. In Comparative Example 8, since the volume ratios of TiC and TaC were high, Ti and Ta were detected in excess of the allowable amounts.

What is claimed is:

1. A member for a plasma processing apparatus, the member comprising:
    a tungsten carbide phase; and
    a sub-phase dispersed in the tungsten carbide phase and including at least one selected from the group consisting of a phase I, a phase II, a phase III, and a phase V,
        wherein the phase I is a carbide phase containing, as a constituent element, at least one of Ta and Nb,
        wherein the phase II is a nitride phase containing, as a constituent element, Ta,
        wherein the phase III is a carbonitride phase containing, as a constituent element, at least one of elements of Group IV, Group V, and Group VI of the periodic table excluding W, and wherein the phase V is a composite carbide phase which is represented by a formula $W_xM_yC_z$, where M represents an iron group element, C represents carbon, W represents tungsten, and x, y, and z each independently represent a numerical value exceeding 0, wherein a content ratio of the tungsten carbide phase is 99% by volume or more, wherein a content ratio of the sub-phase is 1% by volume or less, wherein the tungsten carbide phase and the sub-phase have a porosity of 2% by volume or less, and wherein the member is configured with at least one component exposed to a plasma processing in the plasma processing apparatus.

2. The member according to claim 1, wherein the sub-phase includes the composite carbide phase of the phase V, and the composite carbide phase contains one or both of a $W_3Co_3C$ phase and a $W_3Ni_3C$ phase.

3. The member according to claim 1, wherein the sub-phase includes the phase I, and
the includes at least one constituent element selected from the group consisting of Cr, Ta, V, and Nb.

4. The member according to claim 1, wherein the sub-phase includes the phase I, and
the member is consisting of the tungsten carbide phase and the carbide phase.

5. A member for a plasma processing apparatus, the member consisting of:
a tungsten carbide phase; and
a sub-phase dispersed in the tungsten carbide phase and including a carbon phase,
wherein a content ratio of the tungsten carbide phase is 99% by volume or more,
wherein a content ratio of the carbon phase is from 0.1% to 1% by volume,
wherein the tungsten carbide phase and the sub-phase have a porosity of 2% by volume or less, and
wherein the member is configured with at least one component exposed to a plasma processing in the plasma processing apparatus.

6. The member according to claim 1, wherein the sub-phase includes the phase V, and
the member is consisting of the tungsten carbide phase and the composite carbide phase.

7. A member for a plasma processing apparatus, the member consisting of:
a tungsten carbide phase; and
a sub-phase dispersed in the tungsten carbide phase and including a phase I and a phase V, and
wherein the phase I is a carbide phase containing, as a constituent element, at least one of elements of Group IV, Group V and Group VI of the periodic table excluding W,
wherein the phase V is a composite carbide phase which is represented by a formula $W_xM_yC_z$, where M represents an iron group element, C represents carbon, W represents tungsten, and x, y, and z each independently represent a numerical value exceeding 0, wherein a content ratio of the tungsten carbide phase is 99% by volume or more, wherein a content ratio of the carbon phase is 1% by volume or less, and wherein the tungsten carbide phase and the sub-phase have a porosity of 2% by volume or less.

8. The member according to claim 1, wherein the total content of Fe atoms, Co atoms, and Ni atoms is in a range of 30 to 3,300 atomic ppm.

9. The member according to claim 1, wherein a content of each of a Fe atom, a Co atom, and a Ni atom is 1650 atomic ppm or less.

10. A plasma processing apparatus comprising:
a sintered body,
wherein the sintered body includes a tungsten carbide phase and a sub-phase dispersed in the tungsten carbide phase, the sub-phase including at least one selected from the group consisting of a phase I, a phase II, a phase III, a phase IV, and a phase V,
wherein the phase I is a carbide phase containing, as a constituent element, at least one of elements of Group IV, Group V, and Group VI of the periodic table excluding W,
wherein the phase III is a carbonitride phase containing, as a constituent element, at least one of elements of Group IV, Group V, and Group VI of the periodic table excluding W,
wherein the phase IV is a carbon phase,
wherein the phase V is a composite carbide phase which is represented by a formula $W_xM_yC_z$, where M represents an iron group element, C represents carbon, W represents tungsten, and x, y, and z each independently represent a numerical value exceeding 0,
wherein a content ratio of the tungsten carbide phase is 99% by volume or more,
wherein a content ratio of the sub-phase is 1% by volume or less, and
wherein the tungsten carbide phase and the sub-phase have a porosity of 2% by volume or less.

11. A method for using the member of claim 1 as a member of a plasma processing apparatus, comprising: utilizing the member of claim 1 in the plasma processing apparatus.
a content ratio of the sub-phase is 1% by volume or less, and a porosity is 2% by volume or less.

12. The method of claim 11, wherein the member of the plasma processing apparatus is a sintered body.

13. A method for using the member according to claim 7 as a member of a plasma processing apparatus, comprising: utilizing the member of claim 7 in the plasma processing apparatus.

14. The method of claim 13, wherein the member of the plasma processing apparatus is a sintered body.

* * * * *

UNITED STATES PATENT AND TRADEMARK OFFICE
CERTIFICATE OF CORRECTION

| | |
|---|---|
| PATENT NO. | : 11,434,174 B2 |
| APPLICATION NO. | : 16/830025 |
| DATED | : September 6, 2022 |
| INVENTOR(S) | : Takashi Ikeda et al. |

It is certified that error appears in the above-identified patent and that said Letters Patent is hereby corrected as shown below:

In the Claims

Claim 3 should be corrected to:
--3. The member according to claim 1, wherein the sub-phase includes the phase I, and the phase I includes at least one constituent element selected from the group consisting of Cr, Ta, V, and Nb.--

Claim 11 should be corrected to:
--11. A method for using the member of claim 1 as a member of a plasma processing apparatus, comprising: utilizing the member of claim 1 in the plasma processing apparatus.--

Signed and Sealed this
Fifteenth Day of November, 2022

Katherine Kelly Vidal
*Director of the United States Patent and Trademark Office*